(12) United States Patent
Xia et al.

(10) Patent No.: US 11,574,939 B2
(45) Date of Patent: Feb. 7, 2023

(54) METHOD FOR MANUFACTURING ARRAY SUBSTRATE, ARRAY SUBSTRATE AND DISPLAY DEVICE

(71) Applicants: BEIHAI HKC OPTOELECTRONICS TECHNOLOGY CO., LTD., Guangxi (CN); HKC CORPORATION LIMITED, Guangdong (CN)

(72) Inventors: Yuming Xia, Guangxi (CN); En-tsung Cho, Guangxi (CN); Wei Li, Guangxi (CN)

(73) Assignees: BEIHAI HKC OPTOELECTRONICS TECHNOLOGY CO., LTD., Guangxi (CN); HKC Corporation Limited, Guangdong (CN)

( * ) Notice: Subject to any disclaimer, the term of this patent is extended or adjusted under 35 U.S.C. 154(b) by 0 days.

(21) Appl. No.: 17/159,445

(22) Filed: Jan. 27, 2021

(65) Prior Publication Data

US 2022/0037378 A1 Feb. 3, 2022

(30) Foreign Application Priority Data

Jul. 28, 2020 (CN) .......................... 202010740588.X

(51) Int. Cl.
*H01L 27/12* (2006.01)
*G03F 7/20* (2006.01)

(52) U.S. Cl.
CPC ...... *H01L 27/1288* (2013.01); *G03F 7/70066* (2013.01)

(58) Field of Classification Search
CPC ............. G03F 7/70066; H01L 27/1288; H01L 27/1214; H01L 27/1259; H01L 27/12
See application file for complete search history.

(56) References Cited

U.S. PATENT DOCUMENTS 5,370,969 A 12/1994 Vidusek
2019/0229017 A1* 7/2019 Liu ................... H01L 29/78633

FOREIGN PATENT DOCUMENTS

| CN | 101750903 A | | 6/2010 | |
| CN | 109786335 A | * | 5/2019 | |
| CN | 110112072 A | * | 8/2019 | ....... H01L 29/66969 |

(Continued)

OTHER PUBLICATIONS

Machine translation of CN 110335871, Oct. 2019.*

(Continued)

*Primary Examiner* — Peter B Kim
(74) *Attorney, Agent, or Firm* — Law Offices of Albert Wai-Kit Chan, PLLC

(57) ABSTRACT

Disclosed are a method for manufacturing an array substrate, an array substrate and a display device. The method includes the following operations: sequentially forming a gate, a gate insulation layer, an active layer, an ohmic contact layer and a metal layer on a base substrate; forming a photolithography mask on the metal layer, a thickness of the photolithography mask being between 1.7 μm and 1.8 μm; exposing the photolithography mask through a mask plate to make a uniformity of the photolithography mask in a half-exposed area of the mask plate reach a preset uniformity; and manufacturing the array substrate based on the exposed photolithography mask.

2 Claims, 7 Drawing Sheets

(56) References Cited

FOREIGN PATENT DOCUMENTS

CN          110335871 A     10/2019
JP           H08236767 A  *  9/1996
WO    WO-2015180320 A1  *  12/2015  ............. H01L 21/77

OTHER PUBLICATIONS

Chinese Office Action, dated Feb. 22, 2022, for North Sea Optoelectronic Technology Co., Ltd. Wheatco, Chinese Application No. 202010740588.X, filed Jul. 28, 2020.

Yafei Wang, Study of Digital Maskless Lithography Technology and Large Area Exposure Method, a thesis submitted in Nov. 2015 to Xidian University, China.

* cited by examiner

METHOD FOR MANUFACTURING ARRAY SUBSTRATE, ARRAY SUBSTRATE AND DISPLAY DEVICE

CROSS-REFERENCE TO RELATED APPLICATIONS

The present disclosure claims priority to Chinese Application No. 202010740588.X, filed on Jul. 28, 2020, the entire disclosure of which is incorporated herein by reference.

TECHNICAL FIELD

The present disclosure relates to the technical filed of display, in particular to a method for manufacturing an array substrate, an array substrate and a display device.

BACKGROUND

Nowadays, during the process of manufacturing the thin film transistor array substrate through 4-mask process (4-Mask), a photolithography mask needs to be formed on the metal layer before forming the channel region of the array substrate by etching. A thickness of the photolithography mask in the region corresponding to the channel region (this region corresponds to the half-exposed region of the mask plate) is smaller than the rest.

During the production process, the thickness of the photolithography mask in the channel region is not easy to be controlled. If the thickness is too thin, the ohmic contact layer residue will be formed when the metal layer and the ohmic contact layer are sequentially etched after the photolithography mask is removed. If the thickness is too thick, a photolithography mask residue will be formed when the photolithography mask is subsequently removed, resulting in abnormal dimensions of each layer in the channel region and excessive deviation of critical dimensions (the corresponding metal layer, ohmic contact layer, and active layer cannot be completely etched, resulting in a series of metal layer residues, ohmic contact layer residues and active layer residues). In severe cases, the channel region cannot even be formed, which seriously affects the display performance of the array substrate.

SUMMARY

The present disclosure provides a method for manufacturing an array substrate, including the following operations: sequentially forming a gate, a gate insulation layer, an active layer, an ohmic contact layer and a metal layer on a base substrate; forming a photolithography mask on the metal layer, a thickness of the photolithography mask being between 1.7 μm and 1.8 μm; exposing the photolithography mask through a mask plate to make a uniformity of the photolithography mask in a half-exposed area of the mask plate reach a preset uniformity; and manufacturing the array substrate based on the exposed photolithography mask.

In an embodiment, the operation of exposing the photolithography mask through a mask plate to make a uniformity of the photolithography mask in a half-exposed area of the mask plate reach a preset uniformity includes: exposing the photolithography mask through the mask plate and a photolithography machine to make the uniformity of the photolithography mask in the half-exposed area of the mask plate reach the preset uniformity, a depth of focus of the photolithography machine being between 1.8 μm and 2.0 μm.

In an embodiment, the preset uniformity is between 20% and 40%.

In an embodiment, the method further including: after exposing the photolithography mask, a thickness of the photolithography mask in the half-exposed area reaches 0.4 μm to 0.5 μm.

In an embodiment, the operation of manufacturing the array substrate based on the exposed photolithography mask includes: etching the metal layer, the ohmic contact layer and the active layer beyond the exposed photolithography mask; ashing the photolithography mask to remove the photolithography mask in the half-exposed area; and sequentially etching the metal layer, the ohmic contact layer and the active layer based on the ashed photolithography mask to form the array substrate.

In an embodiment, the operation of ashing the photolithography mask to remove the photolithography mask in the half-exposed area includes: ashing the photolithography mask for 70 seconds to 80 seconds by using oxygen to remove the photolithography mask in the half-exposed area.

In an embodiment, the operation of ashing the photolithography mask to remove the photolithography mask in the half-exposed area includes: ashing the photolithography mask for 80 seconds to 100 seconds by using a first preset amount of sulfur hexafluoride and a second preset amount of oxygen to remove the photolithography mask in the half-exposed area, a ratio of the first preset amount and the second preset amount ranging from 1:1 to 3:1.

In an embodiment, a value of the first preset amount is between 10000 sccm and 24000 sccm, and a value of the second preset amount is between 8000 sccm and 10000 sccm.

In order to achieve the above objective, the present disclosure provides an array substrate. The array substrate is manufactured by the above method for manufacturing the array substrate.

In order to achieve the above objective, the present disclosure provides a display device. The display device is manufactured by the above method for manufacturing the array substrate.

The present disclosure provides a method for manufacturing an array substrate, an array substrate and a display device, the method including: sequentially forming a gate, a gate insulation layer, an active layer, an ohmic contact layer and a metal layer on a base substrate; forming a photolithography mask on the metal layer, a thickness of the photolithography mask being between 1.7 μm and 1.8 μm; exposing the photolithography mask through a mask plate to make a uniformity of the photolithography mask in a half-exposed area of the mask plate reach a preset uniformity; and manufacturing the array substrate according to the exposed photolithography mask. As such, it solves the problem of easy formation of residual ohmic contact layer or residual photolithography mask in the process of forming the channel region of the array substrate, avoids affecting the display performance of the array substrate, thereby improving the stability of the array substrate.

The realization of the objective, functional characteristics, and advantages of the present disclosure are further described with reference to the accompanying drawings.

DETAILED DESCRIPTION OF THE EMBODIMENTS

It should be understood that the specific embodiments described herein are only used to explain the present disclosure, but not to limit the present disclosure.

The present disclosure provides a method for manufacturing an array substrate, which solves the problem of easy formation of residual ohmic contact layer or residual photolithography mask in the process of forming the channel region of the array substrate, avoids affecting the display performance of the array substrate, thereby improving the stability of the array substrate.

Figure 1:
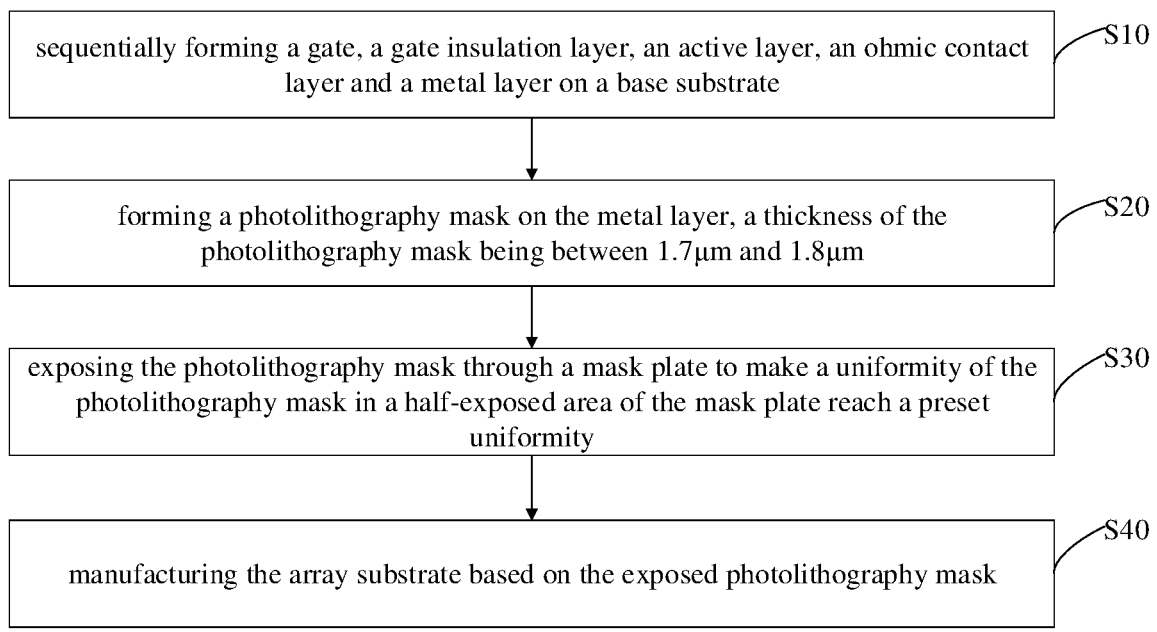
FIG. 1 is a schematic flowchart of a method for manufacturing an array substrate according to an embodiment of the present disclosure.

As shown in FIG. 1, in an embodiment, the method for manufacturing an array substrate includes:

Operation S10, sequentially forming a gate, a gate insulation layer, an active layer, an ohmic contact layer and a metal layer on a base substrate.

In this embodiment, the ohmic contact layer (doped amorphous silicon layer, $N^+A$-Si) between the active layer (amorphous silicon layer, A-Si) and the metal layer in the thin film transistor array substrate may be an N-type ohmic contact layer or a P-type ohmic contact layer.

When manufacturing the thin film transistor array substrate, 4-mask process is used to preform the base substrate (glass substrate), and form the gate on the base substrate, and deposit the gate insulation layer covering the gate on the base substrate by chemical vapor method, and then sequentially form the active layer, the ohmic contact layer and the metal layer on the gate insulation layer (that is, the active layer is above the gate insulation layer, the ohmic contact layer is above the active layer, and the metal layer is above the ohmic contact layer).

It should be noted that the metal layer may be made of one or a combination of manganese, molybdenum, titanium, aluminum and copper. The active layer may be made of A-Si. The gate insulation layer may be made of silicon oxide and/or silicon nitride. The gate may be made of one or a combination of molybdenum, titanium, aluminum and copper. The base substrate may be a flexible substrate such as a glass substrate or polyimide (PI).

Operation S20, forming a photolithography mask on the metal layer, a thickness of the photolithography mask being between 1.7 μm and 1.8 μm.

Figure 5:
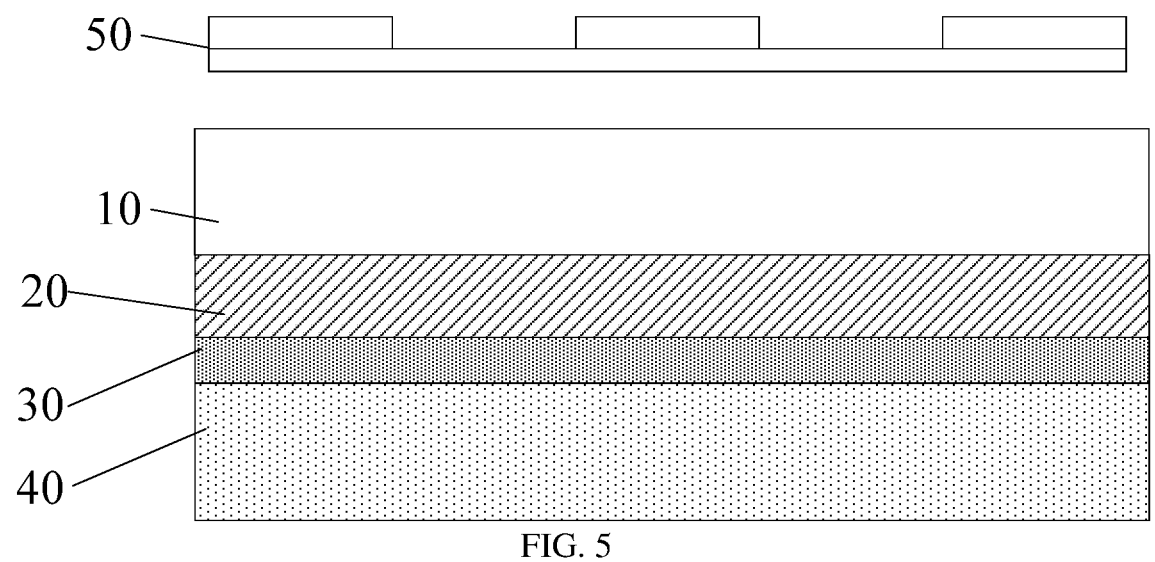
FIG. 5 is a schematic diagram of a photolithography mask of the method for manufacturing an array substrate according to an embodiment of the present disclosure.

As shown in FIG. 5, after the metal layer 20 is deposited and formed on the ohmic contact layer 30 (the ohmic contact layer 30 is above the active layer 40), a photoresist is applied on the metal layer 20, and a pre-baking process and a cooling process are performed on the applied photoresist to form a photolithography mask 10. In an embodiment, the photoresist materials include resins, photosensitizers, solvents and additives. The photosensitizer is the photosensitive component in the photoresist, which has a photochemical reaction to radiant energy in the form of light (especially in the ultraviolet region).

In an embodiment, the thickness of the photolithography mask is between 1.7 μm and 1.8 μm. During the process of manufacturing the array substrate with the thickness of the photolithography mask between 1.7 μm and 1.8 μm, the critical dimension deviation of each layer can be reduced, and the metal layer, the ohmic contact layer and the active layer can be patterned more accurately, thereby improving the stability of the finally formed array substrate.

Operation S30, exposing the photolithography mask through a mask plate to make a uniformity of the photolithography mask in a half-exposed area of the mask plate reach a preset uniformity.

Figure 6:
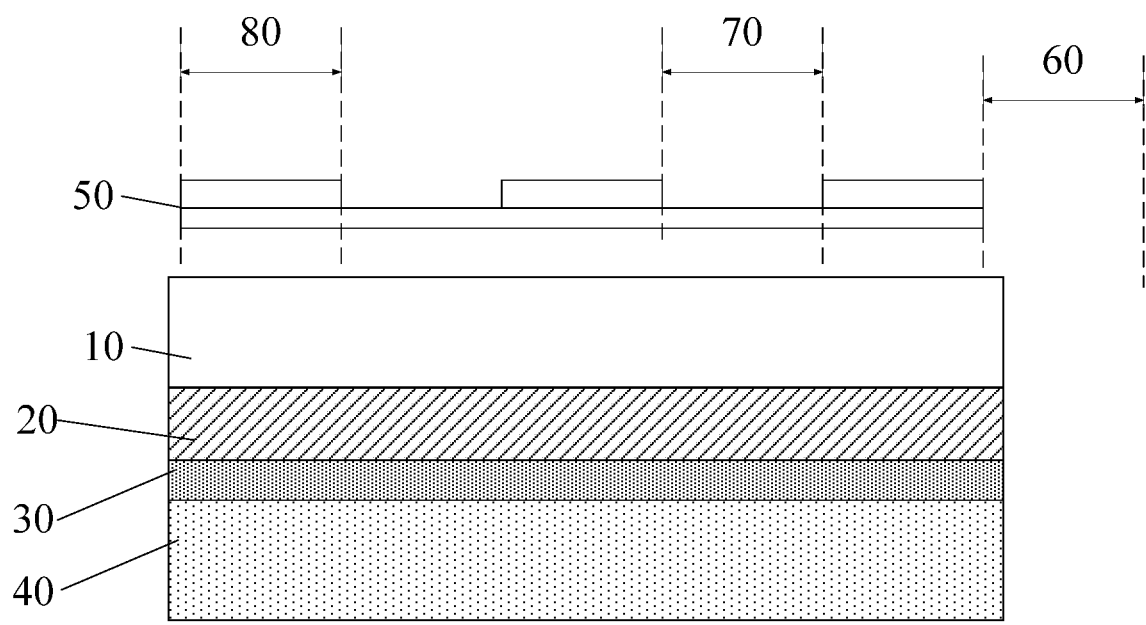
FIG. 6 is a schematic diagram of the photolithography mask before exposure of the method for manufacturing an array substrate according to an embodiment of the present disclosure.

As shown in FIG. 6, the mask plate 50 includes a semi-transparent structure and a non-transparent structure. When the photolithography machine emits ultraviolet light beams through the mask plate 50 to expose the photolithography mask 10, the area where the semi-transparent structure of the mask plate 50 is located corresponds to the half-exposed area 70 that forms the mask plate 50, and the area where the non-transparent structure of the mask plate 50 is located corresponds to the non-exposed area 80 that forms the mask plate 50. When the light beams reach the photolithography mask 10 through the half-exposed area 70, the thickness of the photolithography mask in the area of the half-exposed area 70 is reduced. The light beams generally cannot reach the photolithography mask 10 through the non-exposed area 80. Therefore, the thickness of the photolithography mask within the region of the non-exposed area 80 is not or little affected. However, the area beyond the mask plate 50 can be used as the fully exposed area 60, the photolithography mask within the area of the fully exposed area 60 will be completely removed (that is, when the photolithography mask is exposed). It should be noted that the mask plate can be a single slot mask plate or a double slot mask plate.

The process capability of the photolithography machine mainly considers resolution and depth of focus (DOF). The resolution is the smallest distance between two objects that the optical system can distinguish. DOF is the distance that light can move along the light path to maintain the best focal plane of the image.

The formula for calculating the resolution R is:

$$R = k_1 \frac{\lambda}{NA}$$

The formula for calculating DOF is:

$$DOF = k_2 \frac{\lambda}{(NA)^2}$$

λ is a wavelength of the light wave, NA is a numerical aperture, $k_1$ is a first process factor, and k2 is a second process factor. It can be seen that the resolution of the photolithography machine is proportional to the depth of focus.

In actual production, in order to ensure the mass production of array substrates, the photolithography machine generally uses a larger focal depth, which leads to an increase in the resolution of the photolithography machine. The increase in resolution will cause the resolution of the photolithography machine to decrease. When the resolution is too low, the exposure of the photolithography mask to the light will be uneven, resulting in poor uniformity of the photolithography mask formed after the development process and the etching process in the half-exposed area. As such, when the ashing process is used to remove the photolithography mask, it is easy to form a photolithography mask residue, resulting in poor removal of the photolithography mask in the half-exposed area, and too much photolithography mask remaining in the half-exposed area, which will affect the subsequent manufacturing process of the channel region of the array substrate. However, the photolithography machine with DOF between 1.8 µm and 2.0 µm exposes the photolithography mask with the thickness between 1.7 µm and 1.8 µm, which can ensure that the exposure is uniform, and can avoid the photolithography mask remaining in the half-exposed area after exposure.

Figure 7:
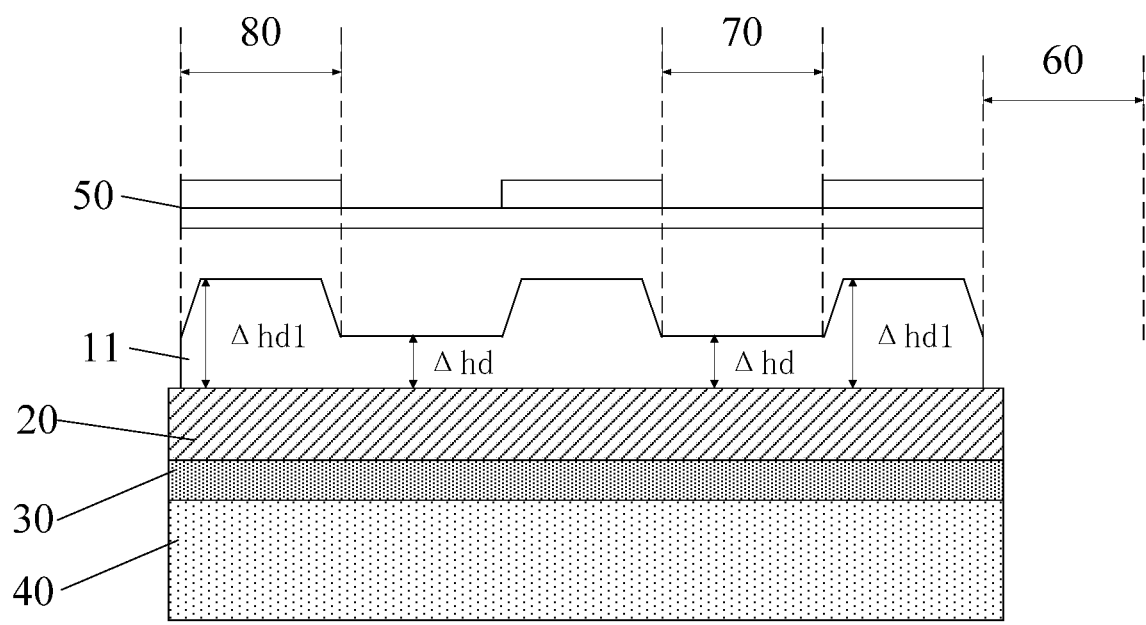
FIG. 7 is a schematic diagram of a photolithography mask after exposure of the method for manufacturing an array substrate according to an embodiment of the present disclosure.

As shown in FIG. 7, the photolithography machine emits light beams, and the mask plate 50 exposes the photolithography mask. The photolithography mask in the fully exposed area 60 is fully exposed. The photolithography mask within the half-exposed area 70 of the mask plate is partially exposed. Then, dry etching is performed on the exposed photolithography mask based on $O_2$ to etch away the photoresist that has been affected by the light to form the exposed photolithography mask 11. After etching the photolithography mask within the half-exposed area 70 of the mask plate, a thickness Δhd of the formed photolithography mask 11 in the half-exposed area 70 of the mask plate is a preset thickness. The preset thickness is between 0.4 µm and 0.5 µm (4000 Å-5000 Å), the preset thickness may be 0.42 µm, 0.43 µm, 0.47 µm or 0.48 µm. However, a thickness Δhd1 of the island photolithography mask 11 within the non-exposed area 80 of the mask plate is between 1.7 µm and 1.8 µm, which corresponds to the thickness of the photolithography mask before exposure. Meanwhile, the photolithography mask in the area corresponding to the fully exposed area 60 is completely removed.

Since the thickness of the photolithography mask before exposure is between 1.7 µm and 1.8 µm, in order to completely remove the photolithography mask in the fully exposed area, DOF of the photolithography machine needs to be greater than the thickness of the photolithography mask before exposure. In an embodiment, the photolithography mask is exposed using the mask plate and the photolithography machine with DOF between 1.8 µm and 2.0 µm. In this way, the critical dimension deviation of the exposed photolithography mask can be reduced, and the uniformity of the exposed photolithography mask in the half-exposed area of the mask plate can reach the preset uniformity. The value of the preset uniformity is between 20% and 40%.

In an embodiment, when setting the exposure parameters of the photolithography machine, the calorific value of photo dose energy of the half-exposed area of the mask plate can be adjusted to adjust the thickness of the half-exposed area of the mask plate after the photolithography mask is formed. After applying photoresist on the metal layer, the photoresist is exposed based on the mask plate and a preset dose of photo dose energy to form the photolithography mask on the metal layer. The value of the preset dose is between 41.5 MJ and 43 MJ. For example, the photo dose energy of 41.5 MJ can adjust the preset thickness of the photolithography mask in the half-exposed area to 0.5 µm, and the photo dose energy of 43 MJ can adjust the preset thickness of the photolithography mask in the half-exposed area to 0.4 µm.

Operation S40, manufacturing the array substrate based on the exposed photolithography mask.

The metal layer, the ohmic contact layer and the active layer beyond the photolithography mask are sequentially etched based on the exposed photolithography mask. Specifically, based on the photolithography mask, the metal layer beyond the photolithography mask is etched by wet etching, and then dry etching is sequentially performed on the ohmic contact layer and the active layer exposed after etching the metal layer.

After sequentially etching the metal layer, the ohmic contact layer and the active layer beyond the photolithography mask, an ashing process is performed on the photolithography mask to remove the photolithography mask within the half-exposed area, so that the surface of the metal layer in the half-exposed area of the mask plate is exposed. As such, the ashing process of the photolithography mask with uniformity of 20% to 40% can avoid the presence of photolithography mask remaining in the half-exposed area.

Based on the photolithography mask after the ashing process, the metal layer, the ohmic contact layer and the active layer are sequentially etched to form the channel region of the array substrate. Then, the remaining photolithography mask is peeled off to form a thin film transistor array substrate including a base substrate, a gate, a gate insulation layer, and a patterned ohmic contact layer, active layer, and metal layer.

It should be noted that in the subsequent process of forming the array substrate, a passivation layer covering the pattern including the ohmic contact layer, the active layer and the metal layer is formed on the gate insulation layer of the array substrate, and a pixel layer passing the passivation via hole through the passivation layer is formed on the gate insulation layer of the array substrate, then the thin film transistor array substrate is formed.

Further, the formed thin film transistor array substrate may be used to manufacture a display device.

In an embodiment, a gate, a gate insulation layer, an active layer, an ohmic contact layer and a metal layer are sequentially formed on a base substrate; a photolithography mask is formed on the metal layer, a thickness of the photolithography mask is between 1.7 µm and 1.8 µm; the photolithography mask is exposed through a mask plate to make a uniformity of the photolithography mask in a half-exposed area of the mask plate reach a preset uniformity; and the array substrate is manufactured according to the exposed photolithography mask. As such, it solves the problem of easy formation of residual ohmic contact layer or residual photolithography mask in the process of forming the channel region of the array substrate, avoids affecting the display performance of the array substrate, thereby improving the stability of the array substrate.

Figure 2:
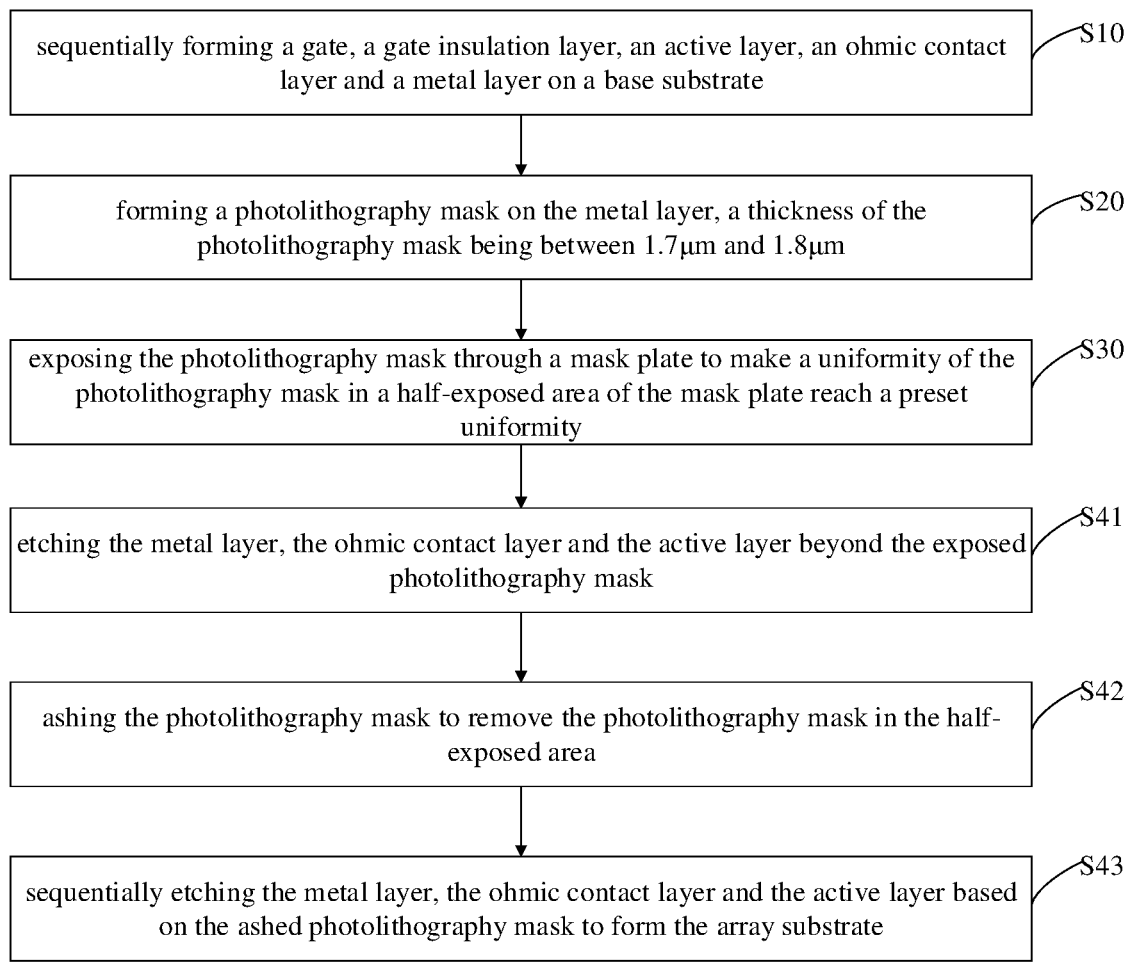
FIG. 2 is a schematic flowchart of the method for manufacturing an array substrate according to another embodiment of the present disclosure.

In another embodiment, as shown in FIG. 2, based on the embodiment shown in FIG. 1, the operation of manufacturing the array substrate according to the exposed photolithography mask comprises:

operation S41, etching the metal layer, the ohmic contact layer and the active layer beyond the exposed photolithography mask;

operation S42, ashing the photolithography mask to remove the photolithography mask in the half-exposed area; and operation S43, sequentially etching the metal layer, the ohmic contact layer and the active layer according to the ashed photolithography mask to form the array substrate.

In this embodiment, the metal layer, the ohmic contact layer and the active layer beyond the photolithography mask are sequentially etched based on the exposed photolithography mask. Specifically, based on the photolithography mask, the metal layer beyond the photolithography mask is etched by wet etching, and then dry etching is sequentially performed on the ohmic contact layer and the active layer exposed after etching the metal layer.

In an embodiment, the metal layer may be wet-etched based on a mixed compound. The mixed compound includes $H_3PO_4$, $CH_3COOH$ and $HNO_3$. During the first dry etching of the ohmic contact layer and the active layer, the amorphous silicon layer may be dry-etched based on the first mixed gas. The first mixed gas includes $SF_6$ and $Cl_2$.

After sequentially etching the metal layer, the ohmic contact layer and the active layer beyond the photolithography mask, an ashing process is performed on the photolithography mask to remove the photolithography mask within the channel region, so that the surface of the metal layer in the half-exposed area of the mask plate is exposed.

Based on the photolithography mask after the ashing process, the metal layer, the ohmic contact layer and the active layer are etched a second time. Specifically, wet etching is performed on the metal layer beyond the photolithography mask. The metal layer in the range corresponding to the half-exposed area is etched to form the source and drain of the metal layer, and the ohmic contact layer corresponding to the half-exposed area is exposed. Then based on the photolithography mask after ashing process and the metal layer after wet etching, dry etching is performed on the ohmic contact layer and the active layer beyond the metal layer to finally form a channel region (a region corresponding to the half-exposed area of the mask plate) of the array substrate.

Specially, the metal layer may be wet-etched based on a mixed compound. The mixed compound includes $H_3PO_4$, $CH_3COOH$ and $HNO_3$. During the second dry etching of the active layer, the amorphous silicon layer may be dry-etched based on the second mixed gas. The second mixed gas includes $SF_6$, $Cl_2$ and $He$.

After the metal layer covers the active layer outside the channel region, a thin film transistor array substrate including a base substrate, a gate, a gate insulation layer, and a patterned ohmic contact layer, an active layer and a metal layer can be formed by peeling off the remaining photolithography mask.

It should be noted that in the subsequent process of forming the array substrate, a passivation layer covering the pattern including the ohmic contact layer, the active layer and the metal layer is formed on the gate insulation layer of the array substrate, and a pixel layer passing the passivation via hole through the passivation layer is formed on the gate insulation layer of the array substrate, then the thin film transistor array substrate is formed.

Further, the formed thin film transistor array substrate may be used to manufacture a display device.

Figure 3:
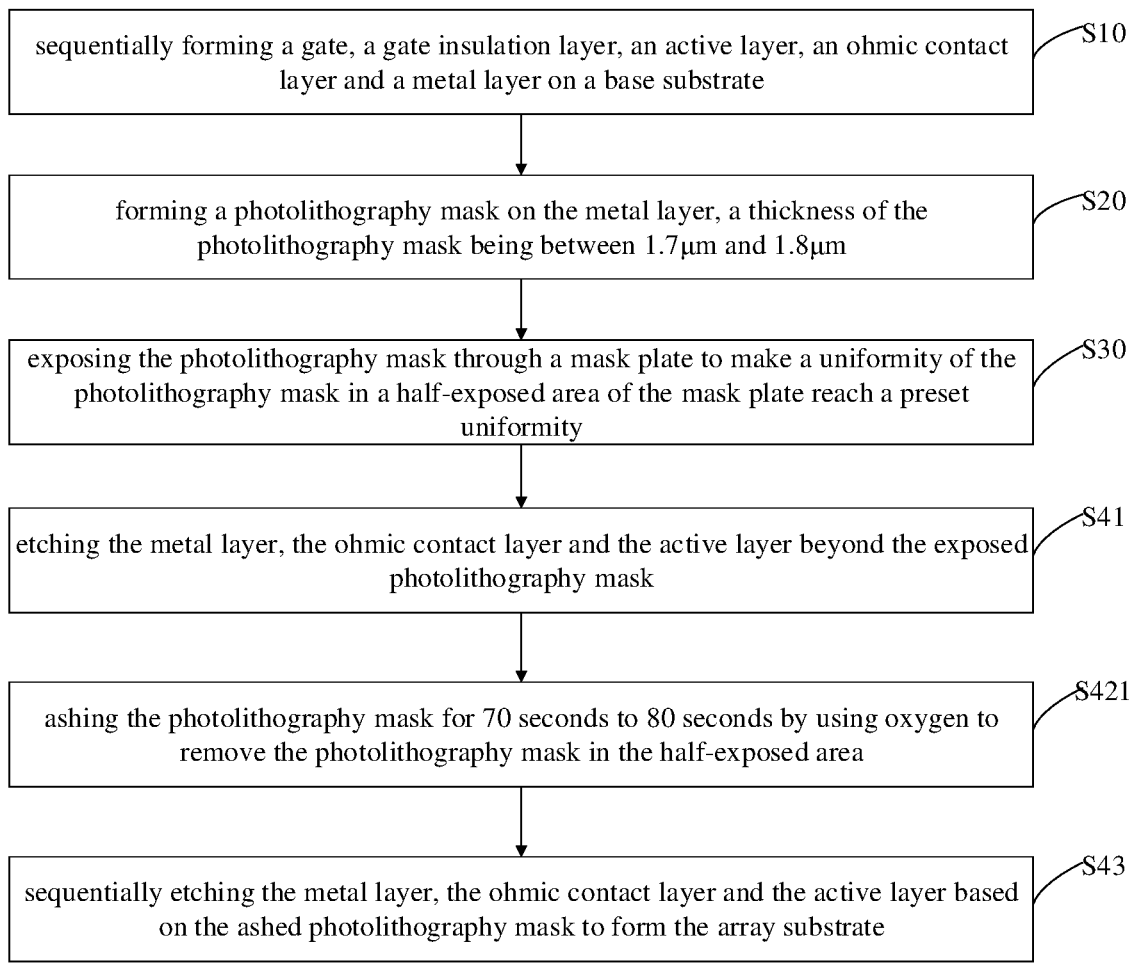
FIG. 3 is a schematic flowchart of the method for manufacturing an array substrate according to still another embodiment of the present disclosure.

In yet another embodiment, as shown in FIG. 3, based on the embodiments as shown in FIG. 1 and FIG. 2, the operation of ashing the photolithography mask to remove the photolithography mask in the half-exposed area includes:

Operation S421, ashing the photolithography mask for 70 seconds to 80 seconds by using oxygen to remove the photolithography mask in the half-exposed area.

In this embodiment, the photolithography mask with a thickness ranging from 4000 Å to 5000 Å is formed within the half-exposed area, and the metal layer, the ohmic contact layer and the active layer are etched beyond the photolithography mask based on the photolithography mask. Then, oxygen is used to ash photolithography mask for 70 seconds to 80 seconds to remove the photolithography mask within the channel region. The dose of oxygen ranges from 8000 sccm to 10000 sccm. That is to use 8000 sccm to 10000 sccm oxygen to ash the photolithography mask for 70 seconds to 80 seconds to remove the photolithography mask within the half-exposed area, such that the surface of the metal layer within the half-exposed area is exposed.

As such, reducing the oxygen reaction time in the ashing process to 70-80 seconds can reduce the oxygen in the preparation environment of the array substrate, and it is difficult to form oxide residues on the surface of the metal layer, so as to avoid the presence of oxide residues on the surface of the metal layer, resulting in subsequent etching of the ohmic contact layer, forming an ohmic contact layer residue in the half-exposed area.

Figure 4:
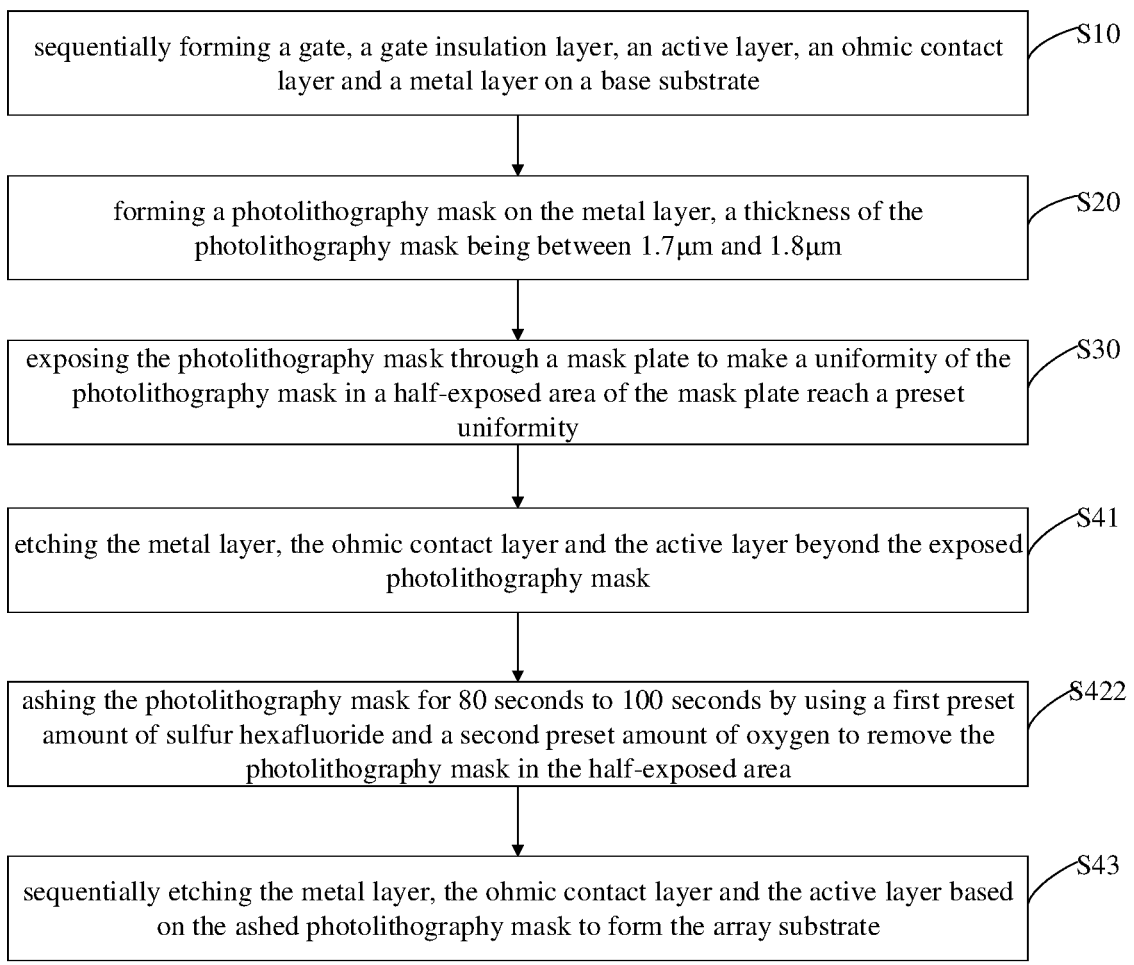
FIG. 4 is a schematic flowchart of the method for manufacturing an array substrate according to still another embodiment of the present disclosure.

In another embodiment, as shown in FIG. 4, based on the embodiments in FIGS. 1 to 3, the operation of ashing the photolithography mask to remove the photolithography mask in the half-exposed area includes:

Operation S422, ashing the photolithography mask for 80 seconds to 100 seconds based on a first preset amount of sulfur hexafluoride and a second preset amount of oxygen to remove the photolithography mask in the half-exposed area.

In this embodiment, the photolithography mask with a thickness ranging from 4200 Å to 5000 Å is formed within the half-exposed area, and the metal layer, the ohmic contact layer and the active layer are etched beyond the photolithography mask based on the photolithography mask. Then, the first preset amount of sulfur hexafluoride and the second preset amount of oxygen are used to ash the photolithography mask for 70 seconds to 80 seconds to remove the photolithography mask within the channel region (the preset time is between 80 seconds and 100 seconds).

In an embodiment, a value of the first preset amount is between 10000 sccm and 24000 sccm, and a value of the second preset amount is between 8000 sccm and 10000 sccm. That is, 8000 sccm to 10000 sccm oxygen and 10000 sccm to 24000 sccm sulfur hexafluoride are used to ash the photolithography mask for 80 seconds to 100 seconds to remove the photolithography mask within the half-exposed area, so that the surface of the metal layer within the half-exposed area is exposed.

As such, during the ashing process, sulfur hexafluoride can react with excess oxygen, which can consume more oxygen when ashing the photolithography mask to reduce the oxygen in the preparation environment of the array substrate, and it is difficult to form oxide residues on the surface of the metal layer, so as to avoid the presence of oxide residues on the surface of the metal layer, resulting in subsequent etching of the ohmic contact layer, forming an ohmic contact layer residue in the half-exposed area.

Besides, the present disclosure further provides an array substrate. The array substrate is manufactured by the above method for manufacturing the array substrate.

The present disclosure solves the problem of easy formation of residual ohmic contact layer or residual photolithography mask in the process of forming the channel region of the array substrate.

Besides, the present disclosure further provides a display device. The display device is manufactured by the above method for manufacturing the array substrate.

The present disclosure avoids affecting the display performance of the array substrate, thereby improving the stability of the array substrate.

The serial numbers of the foregoing embodiments of the present disclosure are only for description, and do not represent the advantages and disadvantages of the embodiments.

Through the description of the above embodiment, those skilled in the art can clearly understand that the above-mentioned embodiments can be implemented by software plus a necessary general hardware platform, of course, it can also be implemented by hardware, but in many cases the former is a better implementation. Based on this understanding, the technical solution of the present disclosure can be embodied in the form of software product in essence or the part that contributes to the existing technology. The computer software product is stored on a storage medium (such as ROM/RAM, magnetic disk, optical disk) as described above, including several instructions to cause a terminal device (which can be a TV, a mobile phone, a computer, a server, an air conditioner, or a network device, etc.) to execute the method described in each embodiment of the present disclosure.

The above are only some embodiments of the present disclosure, and do not limit the scope of the present disclosure thereto. Under the inventive concept of the present disclosure, equivalent structural transformations made according to the description and drawings of the present disclosure, or direct/indirect application in other related technical fields are included in the scope of the present disclosure.

What is claimed is:

1. A method for manufacturing an array substrate, comprising the following operations:
   sequentially forming a gate, a gate insulation layer, an active layer, an ohmic contact layer and a metal layer on a base substrate;
   forming a photolithography mask on the metal layer, a thickness of the photolithography mask being between 1.7 μm and 1.8 μm;
   exposing the photolithography mask through a mask plate to make a uniformity of the photolithography mask in a half-exposed area of the mask plate reach a preset uniformity; and
   manufacturing the array substrate based on the exposed photolithography mask;
   wherein the operation of manufacturing the array substrate based on the exposed photolithography mask comprises:
   etching the metal layer, the ohmic contact layer and the active layer beyond the exposed photolithography mask;
   ashing the photolithography mask to remove the photolithography mask in the half-exposed area; and
   sequentially etching the metal layer, the ohmic contact layer and the active layer based on the ashed photolithography mask to form the array substrate;
   wherein the operation of ashing the photolithography mask to remove the photolithography mask in the half-exposed area comprises:
   ashing the photolithography mask for 80 seconds to 100 seconds by using a first preset amount of sulfur hexafluoride and a second preset amount of oxygen to remove the photolithography mask in the half-exposed area, a ratio of the first preset amount and the second preset amount ranging from 1:1 to 3:1;
   the operation of exposing the photolithography mask through the mask plate to make the uniformity of the photolithography mask in the half-exposed area of the mask plate reach the preset uniformity comprises:
   exposing the photolithography mask through the mask plate and a photolithography machine to make the uniformity of the photolithography mask in the half-exposed area of the mask plate reach the preset uniformity, a depth of focus of the photolithography machine being between 1.8 μm and 2.0 μm.

2. An array substrate, wherein the array substrate is manufactured by a method for manufacturing the array substrate, the method comprising the following operations:
   sequentially forming a gate, a gate insulation layer, an active layer, an ohmic contact layer and a metal layer on a base substrate;
   forming a photolithography mask on the metal layer, a thickness of the photolithography mask being between 1.7 μm and 1.8 μm;
   exposing the photolithography mask through a mask plate to make a uniformity of the photolithography mask in a half-exposed area of the mask plate reach a preset uniformity; and
   manufacturing the array substrate based on the exposed photolithography mask;
   wherein the operation of manufacturing the array substrate based on the exposed photolithography mask comprises:
   etching the metal layer, the ohmic contact layer and the active layer beyond the exposed photolithography mask;
   ashing the photolithography mask to remove the photolithography mask in the half-exposed area; and
   sequentially etching the metal layer, the ohmic contact layer and the active layer based on the ashed photolithography mask to form the array substrate;
   wherein the operation of ashing the photolithography mask to remove the photolithography mask in the half-exposed area comprises:
   ashing the photolithography mask for 80 seconds to 100 seconds by using a first preset amount of sulfur hexafluoride and a second preset amount of oxygen to remove the photolithography mask in the half-exposed area, a ratio of the first preset amount and the second preset amount ranging from 1:1 to 3:1;
   the operation of exposing the photolithography mask through the mask plate to make the uniformity of the photolithography mask in the half-exposed area of the mask plate reach the preset uniformity comprises:
   exposing the photolithography mask through the mask plate and a photolithography machine to make the uniformity of the photolithography mask in the half-exposed area of the mask plate reach the preset uniformity, a depth of focus of the photolithography machine being between 1.8 μm and 2.0 μm.

* * * * *